(12) United States Patent
Rothhardt et al.

(10) Patent No.: US 10,593,552 B2
(45) Date of Patent: Mar. 17, 2020

(54) METHOD FOR DOPING SEMICONDUCTOR SUBSTRATES BY MEANS OF A CO-DIFFUSION PROCESS AND DOPED SEMICONDUCTOR SUBSTRATE PRODUCED BY MEANS OF SAID METHOD

(71) Applicant: FRAUNHOFER-GESELLSCHAFT ZUR FÖRDERUNG DER ANGEWANDTEN FORSCHUNG E. V., München (DE)

(72) Inventors: Philip Rothhardt, Freiburg (DE); Andreas Wolf, Freiburg (DE); Sebastian Meier, Freiburg (DE); Daniel Biro, Freiburg (DE); Sabrina Lohmüller, Freiburg (DE)

(73) Assignee: Fraunhofer-Gesellschaft Zur Förderung der Angewandten Forschung E.V, München (DE)

( * ) Notice: Subject to any disclaimer, the term of this patent is extended or adjusted under 35 U.S.C. 154(b) by 0 days.

(21) Appl. No.: 16/063,527

(22) PCT Filed: Dec. 16, 2016

(86) PCT No.: PCT/EP2016/081335
§ 371 (c)(1),
(2) Date: Jun. 18, 2018

(87) PCT Pub. No.: WO2017/108592
PCT Pub. Date: Jun. 29, 2017

(65) Prior Publication Data
US 2018/0374703 A1 Dec. 27, 2018

(30) Foreign Application Priority Data

Dec. 22, 2015 (DE) .......... 10 2015 226 516

(51) Int. Cl.
*H01L 21/223* (2006.01)
*H01L 21/225* (2006.01)
(Continued)

(52) U.S. Cl.
CPC ........ *H01L 21/223* (2013.01); *H01L 21/2255* (2013.01); *H01L 21/2256* (2013.01); *H01L 29/36* (2013.01); *H01L 31/1804* (2013.01)

(58) Field of Classification Search
CPC ............... H01L 21/2225; H01L 21/223; H01L 21/2255; H01L 31/0288; H01L 29/36
See application file for complete search history.

(56) References Cited

U.S. PATENT DOCUMENTS

2010/0319771 A1* 12/2010 Mihailetchi ......... H01L 31/1804
136/258
2011/0240114 A1* 10/2011 Stewart ............. H01L 31/02167
136/256
(Continued)

FOREIGN PATENT DOCUMENTS

JP       H05-152236 A     6/1993
WO     WO 2008/061806 A1  5/2008
WO     WO 2009/064183 A1  5/2009

OTHER PUBLICATIONS

Dastgheib-Shirazi et al., "Relationship between diffusion parameters and phosphorus precipitation during the $POCl_3$ diffusion process," *Energy Procedia* 38: 254-262 (2013).
(Continued)

Primary Examiner — Zandra V Smith
Assistant Examiner — John M Parker
(74) Attorney, Agent, or Firm — Leydig, Voit & Mayer, Ltd.

(57) ABSTRACT

The invention relates to a method for doping semiconductor substrates by means of a co-diffusion process. First, semi-
(Continued)

conductor substrates are coated at least on one side with a layer containing at least one first dopant. Two of said substrates in each case are arranged in a process chamber in such a way that two of the coated sides thereof are brought in direct contact.

21 Claims, 2 Drawing Sheets

(51) Int. Cl.
*H01L 31/18* (2006.01)
*H01L 29/36* (2006.01)

(56) References Cited

U.S. PATENT DOCUMENTS

2012/0280183 A1\* 11/2012 Kelman ................ C04B 35/117
  252/501.1
2013/0288470 A1  10/2013 Takahashi et al.

OTHER PUBLICATIONS

Keding et al., "Silicon Doping Performed by Different Diffusion Sources Aiming Co-Diffusion," Conference Paper, 27th European Photovoltaic Solar Energy Conference and Exhibition, EU PVSEC 2012: Proceedings of the international conference held in Frankfurt, Germany, Sep. 24-28, 2012 (6 pgs.).
Kumar et al., "Effect of oxygen ambient during POCl3 diffusion on the performance of silicon solar cells," IEEE 37$^{th}$ Photovoltaic Specialists Conference (PVSC), Jun. 19, 2011, pp. 2167-2169 (2011).
Rothhardt et al., "Characterization of POCl$_3$-Based Codiffusion Processes for Bifacial N-Type Solar Cells," *IEEE Journal of Photovoltaics* 4(3): 827-833 (2014).
Rothhardt et al., "Co-diffusion from APCVD BSG and POCl$_3$ for Industrial n-type Solar Cells," *Energy Procedia* 38: 305-311 (2013).
European Patent Office, International Search Report in International Application No. PCT/EP2016/081335 (dated Feb. 27, 2017).
European Patent Office, Written Opinion in International Application No. PCT/EP2016/081335 (dated Feb. 27, 2017).
International Bureau of WIPO, International Preliminary Report on Patentability in International Application No. PCT/EP2016/081335 (dated Jul. 5, 2018).

\* cited by examiner

METHOD FOR DOPING SEMICONDUCTOR SUBSTRATES BY MEANS OF A CO-DIFFUSION PROCESS AND DOPED SEMICONDUCTOR SUBSTRATE PRODUCED BY MEANS OF SAID METHOD

CROSS-REFERENCE TO RELATED APPLICATIONS

This patent application is the U.S. national phase of International Application No. PCT/EP2016/081335, filed on Dec. 16, 2016, which claims the benefit of German Patent Application No. 10 2015 226 516.1, filed Dec. 22, 2015, the disclosures of which are incorporated herein by reference in their entireties for all purposes.

The present invention relates to a method for doping semiconductor substrates by means of a co-diffusion process. Firstly, semiconductor substrates are hereby coated, at least on one side, with a layer comprising at least one first dopant. Respectively two of these semiconductor substrates are disposed in a process chamber such that two of their coated sides are brought into direct contact. Subsequently, at least one second dopant, in the form of a gaseous dopant source, is introduced into the process chamber. Finally introduction of the first dopant and of the second dopant into the semiconductor substrates is effected, during which the first dopant and the second dopant diffuse into the semiconductor substrates, at the same time, at least partially. The present invention relates, in addition, to a doped semiconductor substrate produced with the method according to the invention.

Co-diffusion processes serve for simultaneous doping of a wafer with boron and phosphorus. According to the current state of the art which is described e.g. in P. Rothhardt, S. Meier, S. Maier, K. Jiang, A. Wolf, and D. Biro, IEEE Journal of Photovoltaics 4, 827 (2014), this doping is achieved as follows:

Before the diffusion process, a boron-containing source is applied on the wafer, on one side, e.g. by means of chemical vapour phase deposition at atmospheric pressure (APCVD) or plasma-enhanced chemical vapour phase deposition (PECVD). Subsequently respectively one wafer is loaded into respectively one slot of a quartz boat and subjected in a tube furnace to a $POCl_3$-containing atmosphere. During the high-temperature step, boron diffuses out of the boron-containing source and phosphorus out of the process atmosphere into the wafer.

The challenge in the diffusion process resides, inter alia, in avoiding a "boron rich layer" (BRL) and doping homogeneously at the same time.

According to the state of the art, this is achieved by using a highly doped boron glass source and addition of a high oxygen concentration in the process atmosphere. The highly doped boron glass source thereby ensures a homogeneous doping with simultaneous production of a BRL. This BRL is however oxidised at the end of the process by the high oxygen concentration and can subsequently be removed simply wet-chemically. A further possibility which, however, increases the process complexity and leads to a significant increase in costs is the removal of the BRL by a further, e.g. wet-chemical process step.

One problem, as yet unresolved, in co-diffusion processes resides in the reproducibly homogeneous doping of the wafer. Thus when processing according to the state of the art, doping atoms diffuse from the tube wall into the wafer, during the heating phase of the high-temperature process, and produce a non-homogeneous doping.

A further challenge concerns the homogeneity of the doping over the quartz boat. According to the state of the art, the door of the quartz tube is opened in order to admit the quartz boat. The part of the tube which is orientated towards the door thereby cools more than the part at a further remove from the door. This leads to the different zones in the boat having different temperatures at least during a part of the heating phase and thus an undesired difference in the doping of different wafers being produced.

In order to increase the throughput of diffusion processes, the "backtoback" method can be applied, as is described for example in WO 2008/061806 A1. In the "backtoback" method, respectively two wafers are introduced into a slot of a diffusion boat. As a result, the throughput can be doubled. In the state of the art, only one dopant is introduced into the process atmosphere during a diffusion by means of "backtoback" methods. In order to produce boron- and phosphorus doping, two high-temperature steps are thus required. After doping of the one wafer side with a dopant, the wafers must be rotated by 180° so that, now in a second process step, the respectively other side can react with the second dopant.

A co-diffusion process using the "backtoback" method is however not possible according to the state of the art since, when using the "backtoback" method, no homogeneous interaction of the covered wafer side with oxygen in the process atmosphere is possible and hence the formation of a BRL cannot be completely avoided.

Starting herefrom, it was therefore the object of the present invention to indicate a method with which semiconductor substrates can be doped economically and in the shortest possible time with a first dopant on one side and with a second dopant on another side.

This object is achieved by the features of the method and the doped semiconductor substrate described herein, and the advantageous developments thereof.

DETAILED DESCRIPTION OF THE INVENTION

Figure 1:
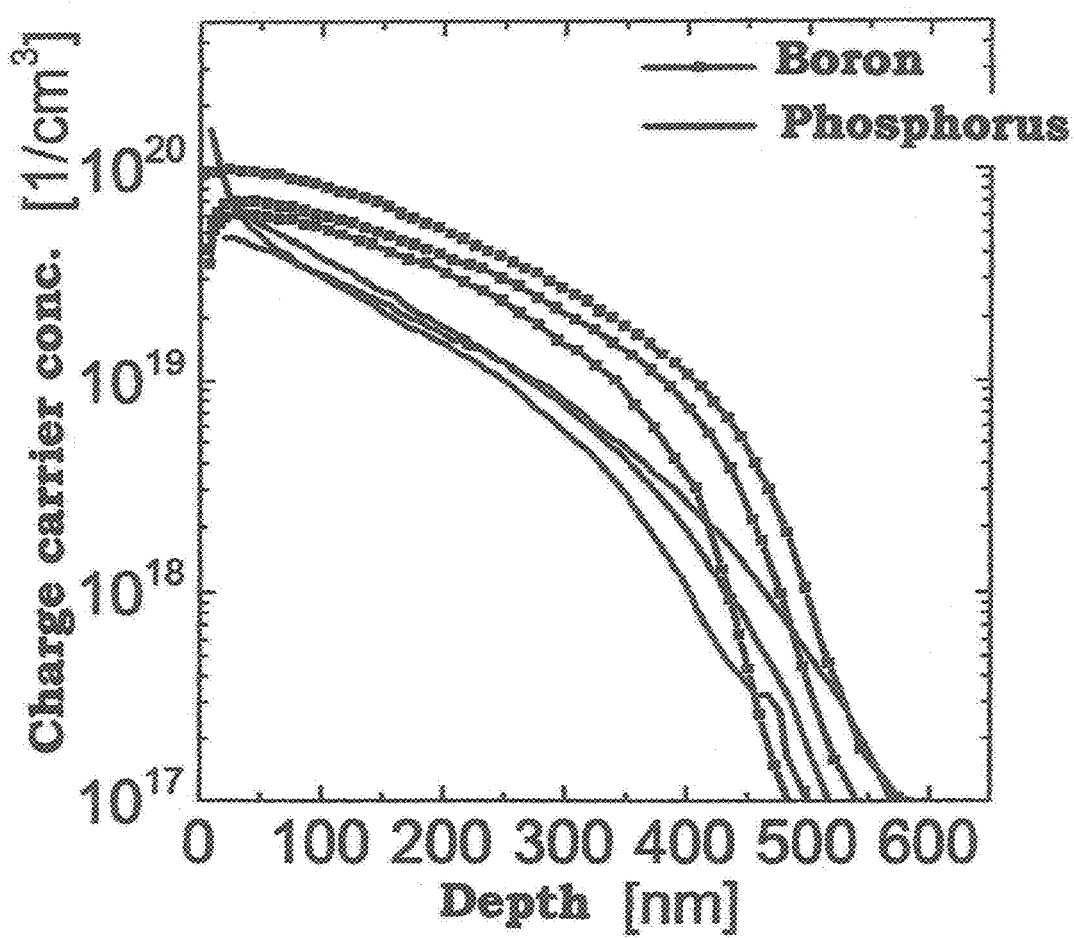
FIG. 1 depicts the doping profiles of boron and phosphorus produced in accordance with an embodiment of the invention.

According to the invention, a method for doping semiconductor substrates by means of a co-diffusion process is hence indicted, in which
  a) semiconductor substrates are coated, at least on one side, with a layer comprising at least one first dopant,
  b) respectively two of these coated semiconductor substrates are disposed in a process chamber such that two of their coated sides are brought into direct contact,
  c) subsequently at least one second dopant, in the form of a gaseous dopant source, is introduced into the process chamber, and
  d) introduction of the first dopant and of the second dopant into the semiconductor substrates is effected, during which the first dopant and the second dopant diffuse into the semiconductor substrates, at the same time, at least partially.

In the method according to the invention, firstly, in step a), semiconductor substrates are coated, at least on one side, with a layer comprising at least one first dopant, i.e. a stratified dopant source. Respectively two of these semiconductor substrates are then disposed, in step b), in a process chamber such that two of their coated sides, i.e. sides which have the layer deposited in step a), are brought into direct contact. Subsequently, in step c), at least one second dopant, in the form of a gaseous dopant source, is introduced into the process chamber. Finally, in step d), introduction of the first dopant and of the second dopant into the semiconductor substrates is effected, during which the first dopant and the second dopant diffuse into the semiconductor substrates, at the same time, at least partially. The first dopant hereby diffuses from the layer deposited in step a), i.e. from the stratified dopant source, into the semiconductor substrates. At the same time, the second dopant diffuses from the gaseous dopant source into the semiconductor substrates, this also being able to be effected by the fact that, firstly, by interaction of the semiconductor substrate with the gaseous dopant source in step d), a layer comprising the second dopant is formed on the substrate, from which then the second dopant diffuses into the substrate. The first dopant can thereby diffuse into the semiconductor substrates only where the layer comprising the first dopant was applied in step a). In addition, the second dopant can diffuse from the gaseous dopant source located in the atmosphere of the process chamber, into the semiconductor substrates only at the places which are exposed and therefore come into contact with the atmosphere of the process chamber.

With the method according to the invention, it is possible to dope semiconductor substrates with a first dopant on one side and with a second dopant on the other side. For this purpose, e.g. in step a), only the front-side of the semiconductor substrates can be coated with the layer comprising the first dopant, the coating of the front-side being effected over the entire area. In step b), then respectively two of these coated semiconductor substrates would be disposed such that the two front-sides, coated over the entire area, are brought into direct contact. During introduction in step d), in this case the first dopant could diffuse into the semiconductor substrates only respectively on the front-side. The second dopant introduced, in step c), in the form of a gaseous dopant source could, in contrast, diffuse merely respectively on the rear-side into the semiconductor substrates since only these are exposed, in contrast to the front-sides. It can hence be ensured that the semiconductor substrates are doped on one side with the first dopant and, on the other side, with the second dopant, only one introduction step being required for this purpose.

In step a), semiconductor substrates are coated, at least on one side, with a layer comprising at least one first dopant. This layer consequently concerns a dopant source, e.g. a boron source, which is deposited, in layers, on the semiconductor substrates. The layer can be applied on the semiconductor substrates by means of a coating method, e.g. by means of chemical vapour phase deposition at atmospheric pressure (APCVD), plasma-enhanced chemical vapour phase deposition (PECVD), inkjet printing, screen printing or rotational coating. Preferably, the layer applied in step a) consists of borosilicate glass (BSG), of a boron-containing screen-printing paste or of inkjet ink. The second dopant can concern phosphorus, e.g. gas phase $POCl_3$ diffusion. If the second dopant concerns boron (e.g. gas phase $BBr_3$ diffusion), then the layer deposited in step a) can be a phosphosilicate glass (PSG), a phosphorus-containing screen-printing paste or an inkjet ink.

In step a), the semiconductor substrates can be coated, e.g. merely on one side and over the entire area on this one side, with the layer comprising the first dopant. If the semiconductor substrates have, e.g. respectively a front-side and a rear-side, for example the front-sides can be provided respectively over the entire area with the layer comprising the first dopant and the rear-sides can remain uncoated.

In step a), it is also possible that the semiconductor substrates are coated, on multiple sides or both sides, with the layer comprising the first dopant. If the semiconductor substrates have, e.g. respectively a front-side and a rear-side, for example the front sides can be provided, over the entire area, with the layer comprising the first dopant and in addition the rear-sides can be provided, only partially, with the layer comprising the first dopant. Such a method variant arises, for example if the front side is provided, over the entire area, with the layer comprising the first dopant during step a) and, technologically defined, a wrap-around of the layer about the wafer edge on the rear-side of the substrate is effected.

Between step a) and step b), no specific introduction of the first dopant into the semiconductor substrate is effected, e.g. by specific heating, implemented for this purpose, of the layer applied in step a) or of the coated semiconductor substrates. If the layer applied in step a) concerns a printed layer, a drying process can be implemented between step a) and step b), which drying process does not however lead to a significant diffusion of the first dopant into the substrate.

In step b), respectively two of the semiconductor substrates coated in step a) are disposed in a process chamber such that two of their coated sides are brought into direct contact. This corresponds to a "backtoback" loading. The two coated sides of both semiconductor substrates are thereby preferably placed together in a congruent and form-fitting manner. The coated substrates used in step b) concern exclusively the semiconductor substrates which were coated, in step a), at least on one side, with a layer comprising the first dopant and also still have this layer.

If the semiconductor substrates have for example respectively a front-side and a rear-side and for example merely the front-sides have been coated in step a), then, in step b), two of these semiconductor substrates, coated merely on one side, can be disposed for example in a process chamber such that the front-side of the one semiconductor substrate is brought into direct contact with the front-side of the other semiconductor substrate and the two front-sides are thereby placed together in a congruent and form-fitting manner.

If the semiconductor substrates have for example respectively a front-side and a rear-side and, in step a), for example the front-sides are coated over the entire area and if the rear sides have been coated merely partially, then, in step b), two of these semiconductor substrates, coated on two sides, can be disposed for example in a process chamber such that the front side, coated over the entire area, of the one semiconductor substrate can be brought into direct contact with the front-side, coated over the entire area, of the other semiconductor substrate and the two front-sides, coated over the entire area, are thereby placed together in a congruent and form-fitting manner.

The semiconductor substrates preferably have a front-side and a rear-side. The semiconductor substrates can concern wafers.

In the method according to the invention, because of the use of "backtoback" loading, twice the throughput of semiconductor substrates can be achieved. The result of this is a very rapid and economical process.

In contrast to "backtoback" methods known from the state of the art, in which the dopants are introduced respectively individually and in two separate steps into the semiconductor substrates, introduction of the first and second dopant is effected, according to the present invention, in one step, namely in step d). In contrast to "backtoback" methods from the state of the art, in the method according to the invention, at least one introduction step less is therefore implemented, which leads to savings in cost and also to an acceleration of the method. With the method according to the invention, a higher throughput can hence be achieved.

Normally in a "backtoback" loading, the abutting sides of the semiconductor substrates do not interact, or only partially, with the atmosphere in the process chamber, for which reason a uniform doping of this side is not possible. In the method according to the invention, interaction of these abutting sides with the atmosphere in the process chamber is however no longer necessary since a layer comprising a dopant, i.e. a stratified dopant source, is applied already in advance in step a) on these sides.

A preferred variant of the method according to the invention is distinguished by, in step a), semiconductor substrates being coated, at least on one side, with a layer comprising at least one first dopant, one side of each semiconductor substrate thereby being coated over the entire area and, in step b), respectively two of these coated semiconductor substrates being disposed in a process chamber such that two of their sides, coated over the entire area, are brought into direct contact.

In a further preferred variant of the method according to the invention, during step c), the particle concentration of the gaseous dopant source in the atmosphere within the process chamber is less than 0.5%, preferably less than 0.1%. By means of such a low concentration of gaseous dopant source, the interaction of the gaseous dopant source with the layer comprising the first dopant can be kept low. In this way, very homogeneous dopings can be obtained. It can thereby be achieved that the doping both for different semiconductor substrates and for different positions on one semiconductor substrate is almost identical.

A further preferred variant is characterised in that, during step d), the atmosphere within the process chamber comprises oxygen, the oxygen concentration in the atmosphere within the process chamber thereby being preferably higher than 0.1% and lower than 5%, particularly preferably higher than 0.1% and lower than 3%, very particularly preferably higher than 0.1% and lower than 1%. Too high an oxygen concentration in the atmosphere of the process chamber leads to the first dopant diffusing into the semiconductor substrate in too low quantities at specific places. As a result of a correspondingly low concentration of oxygen, the interaction of the oxygen in the atmosphere of the process chamber with the layer comprising the first dopant can be kept low. It can thus be avoided that the first dopant diffuses into the semiconductor substrate in too low quantities at specific places. In this way, the homogeneity of the doping can also be increased.

A further preferred variant is characterised in that, during step d), the oxygen content of the process atmosphere within the process chamber is increased, the oxygen concentration at the beginning of step d) being preferably lower than 5% and, at the end of step d), higher than 10%, particularly preferably, at the beginning of step d), lower than 1% and, at the end of step d), higher than 40%, very particularly preferably, at the beginning of step d), lower than 0.1% and, at the end of step d), higher than 60%.

Furthermore, it is preferred that, after step d), the oxygen content of the process atmosphere within the process chamber is increased during the cooling process, the oxygen concentration being preferably higher than 10%, particularly preferably higher than 40%, very particularly preferably higher than 60%.

It is consequently ensured that firstly, at the beginning of step d), a sufficient quantity of first dopant diffuses out of the layer into the semiconductor substrate. A BRL, thereby possibly forming, is again converted and oxidised by the concentration of oxygen which is subsequently increased. At the same time, the surface concentration of second dopant on the uncoated side of the semiconductor substrate can, by this variant, be lowered to below 1,020 atoms/cm−3. An initially higher surface concentration above 1,020 atoms/cm−3 of second dopant on the uncoated side of the semiconductor substrate effects greater removal of impurities from the semiconductor substrate (getter processing). Both properties, getter processing by an initially high surface concentration of second dopant at the beginning of step d) and also a low surface concentration at the end of the process, reduce the charge carrier recombination and increase the solar cell efficiency.

An increase in homogeneity of the doping can therefore be achieved by the method according to the invention, for example by the interaction between the layer comprising the first dopant and the gaseous dopant source in the atmosphere of the process chamber being kept low. Such an interaction does not take place distributed uniformly over the entire layer, namely because of the "backtoback" loading of the semiconductor substrates, but rather mainly at the edge of the semiconductor substrates where the layer comprising the first dopant can come into contact with the gaseous dopant source. By means of an interaction between the layer comprising the first dopant and the gaseous dopant source in the atmosphere of the process chamber, the doping with the first dopant is influenced. If such an interaction takes place mainly only in the edge regions of the semiconductor substrate, this leads to a non-homogeneous doping. Minimising the interaction between the layer comprising the first dopant and the gaseous dopant source in the atmosphere of the process chamber leads therefore ultimately to an increase in the homogeneity of the doping.

Furthermore, it is preferred that the concentration of the first dopant in the layer produced in step a) (proportion of dopant atoms of the total atoms of the layer produced in step a)) is less than 10%, preferably less than 5%. By means of such a low concentration, the formation of a "boron rich layer" (BRL) can be prevented. In co-diffusion processes from the state of the art, the formation of a BRL is prevented by in situ oxidation. This is however not possible in the method according to the invention since an interaction of the coated sides of the semiconductor substrates, which is over the entire area for this purpose, cannot take place. The concentration of the first dopant in the layer produced in step a) or the proportion of dopant atoms of the total atoms of the layer produced in step a) can be determined by secondary ion mass spectrometry or atom emission spectrometry.

According to a further preferred embodiment, the introduction of the first and second dopant, in step d), is effected at temperatures of 800 to 1,000° C. and/or over a period of time of 1 to 120 min. During step d), it is preferred that the temperatures of several, preferably all, regions within the process chamber deviate from each other by less than 5° C. Because of an almost identical temperature prevailing in the process chamber, the homogeneity of the doping can be increased.

A further preferred variant of the method according to the invention is distinguished by step c) being effected before and/or at the beginning of step d).

In addition, it is preferred that, during step c), a temperature of 850° C., preferably 800° C., is not exceeded within the process chamber. As a result, non-uniform formation of a dopant layer of the second dopant can be avoided.

In the case of diffusion processes, the diffusion of dopant out of the walls of the process chamber can lead to a non-homogeneous doping of the semiconductor substrate. This can be reduced by introduction of the gaseous dopant source into the process chamber being effected as early as possible, in particular before the maximum temperature of the introduction step is achieved.

In a further preferred embodiment, from step c) to step d), the temperature within the process chamber is increased by 50 to 250° C., preferably by 50 to 200° C. This temperature increase is preferably implemented at the end of step c) or directly subsequent to step c). For example, the temperature during step c) is 800° C. and, during step d), 900° C., an increase from step c) to step d) by 100° C. being undertaken. During the temperature increase from step c) to step d), it is preferred that the temperature of several, preferably all, regions within the process chamber deviate from each other by less than 5° C.

A further preferred variant of the method according to the invention is characterised in that, between step b) and c), the temperature of several, preferably all, regions within the process chamber is adjusted such that the temperatures of these regions deviate from each other by less than 5° C., preferably a temperature of 850° C., preferably 800° C., not hereby being exceeded within the process chamber.

It is hereby preferred that step c) is effected at the latest 60 s after, preferably directly after, the moment at which the temperatures of the regions within the process chamber are adjusted such that they deviate from each other by less than 5° C.

Since even during the heating process, dopant can diffuse into the semiconductor substrates, it is advantageous if already during the heating process as similar a temperature as possible prevails in the regions within the process chamber in order thus to avoid non-homogeneities within the doping.

A further preferred embodiment is characterised in that the first dopant is boron and the second dopant phosphorus or in that the first dopant is phosphorus and the second dopant boron.

Furthermore, it is preferred that
the second dopant is phosphorus and the gaseous dopant source is $POCl_3$ and/or $PH_3$, or
the second dopant is boron and the gaseous dopant source is selected from the group consisting of $BBr_3$, $BCl_3$, $B_2H_6$ and mixtures hereof.

A further preferred embodiment is characterised in that the gaseous dopant source in step c) is deposited at a pressure less than 500 mbar, preferably less than 300 mbar. This enables tight packing of the substrates in the process chamber and is advantageous for a high throughput.

A further preferred variant of the method according to the invention is characterised in that the gaseous dopant source is $POCl_3$ and a $POCl_3$ bubbler is used for introducing the $POCl_3$ into the process chamber, the carrier gas flow through the $POCl_3$ bubbler during step c) being less than 1.5 standard litre per minute, preferably less than 1.0 standard litre per minute. A low $POCl_3$ gas flow is required in order to avoid too high doping with phosphorus, in particular in connection with a low oxygen concentration during step d) which is required for a successful doping from the layer comprising the first dopant. By limiting the oxygen concentration in step d), a high phosphorus doping, introduced previously in step c), can no longer be adequately compensated for by subsequent oxidation of the surface in step d). In addition, such an interaction between the phosphorus-containing process atmosphere and the layer comprising the first dopant can be reduced, as a result of which penetration of phosphorus through the layer comprising the first dopant is avoided.

According to a further preferred embodiment, the coating in step a) is effected by means of chemical vapour phase deposition at atmospheric pressure (APCVD), plasma-enhanced chemical vapour phase deposition (PECVD), inkjet printing, screen printing or rotational coating.

Furthermore, it is preferred that the process chamber is a tube furnace or a continuous furnace.

In a further preferred variant of the method according to the invention, in step a), the semiconductor substrates are provided with the layer comprising the first dopant only on one side, the coating on the one side being effected over the entire area. If the semiconductor substrates have, e.g. respectively a front-side and a rear-side, e.g. the front-sides can be provided with the layer comprising the first dopant and the rear-sides can remain uncoated.

An alternative variant of the method according to the invention is distinguished by, in step a), a front-side of each semiconductor substrate being provided, over the entire area, with the layer comprising the first dopant and a rear-side, situated opposite the front-side, of each semiconductor substrate being provided, only partially, with the layer comprising the first dopant, e.g. technologically defined, a wrap-around of the layer about the wafer edge during step a), in step c) an additional quantity of second dopant being introduced into the process chamber which overcompensates for the part of the first dopant situated on the rear-side of the semiconductor substrates. In a preferred embodiment, the rear-side of each semiconductor substrate is coated only in the regions which are at a distance of less than 1 cm from the edge of the rear-side of the respective semiconductor substrate.

Some dopant media cannot be applied on the front-side of a semiconductor substrate merely on one side, but rather produce a wrap-around on the rear-side of less than 1 cm. The front-side here is therefore coated completely, whereas the rear-side is coated only partially. This leads, in step d), not only to the second dopant but also the first dopant diffusing into the semiconductor substrate on the rear-side. In order to counter disadvantages resulting therefrom, such as e.g. non-homogeneities of the doping on the rear-side, an additional quantity of second dopant is introduced into the process chamber in step c), which overcompensates for the part for the first dopant situated on the rear-side of the semiconductor substrates. In this way, despite a wrap-around resulting during the coating in step a), a relatively homogeneous doping of the rear-side of the semiconductor substrate with the second dopant can be achieved.

The present invention also relates to a doped semiconductor substrate which is produced according to the just-described variant of the method according to the invention. This semiconductor substrate according to the invention is characterised in that the semiconductor substrate has a lateral gradient in the dopant profile on the rear-side thereof, the proportion of first dopant, on the rear-side of the semiconductor substrate, decreasing from the edge of the semiconductor substrate towards the centre of the semiconductor substrate.

The present invention is explained in more detail with reference to the subsequent Figures and also the subsequent embodiment without restricting the invention to the specially illustrated parameters.

EMBODIMENT

Wafers are coated, on one side, with a borosilicate glass (BSG) layer with a dopant concentration of $2 \cdot 10^{22}$ cm$^{-3}$. Then respectively two wafers are introduced into a quartz boat with the coated sides towards each other. This quartz boat is then introduced into a quartz tube. After closing the tube door, the temperature in the individual heating zones is brought to $(750\pm5)°$ C. Thereafter, POCl$_3$ is introduced into the atmosphere, this being able to take place either before or during the heating process. The heating process leads to achieving a peak temperature of 950° C. During this heating process, the temperatures in the five heating zones of the quartz tube deviate from each other by less than 5° C. After conclusion of the high-temperature process, the wafers are then removed from the furnace.

Solar cells which were diffused according to the method described here achieve the following IV parameters: $V_{OC}$=653 mV, $J_{XC}$=38.6 mA/cm$^2$, FF=79.6%, conversion efficiency=20.1%.

FIG. 1 shows doping profiles by way of example which were produced with the method according to the invention. It emerges clearly herefrom that, with the method according to the invention, a large number of different doping profiles can be produced.

Figure 2:
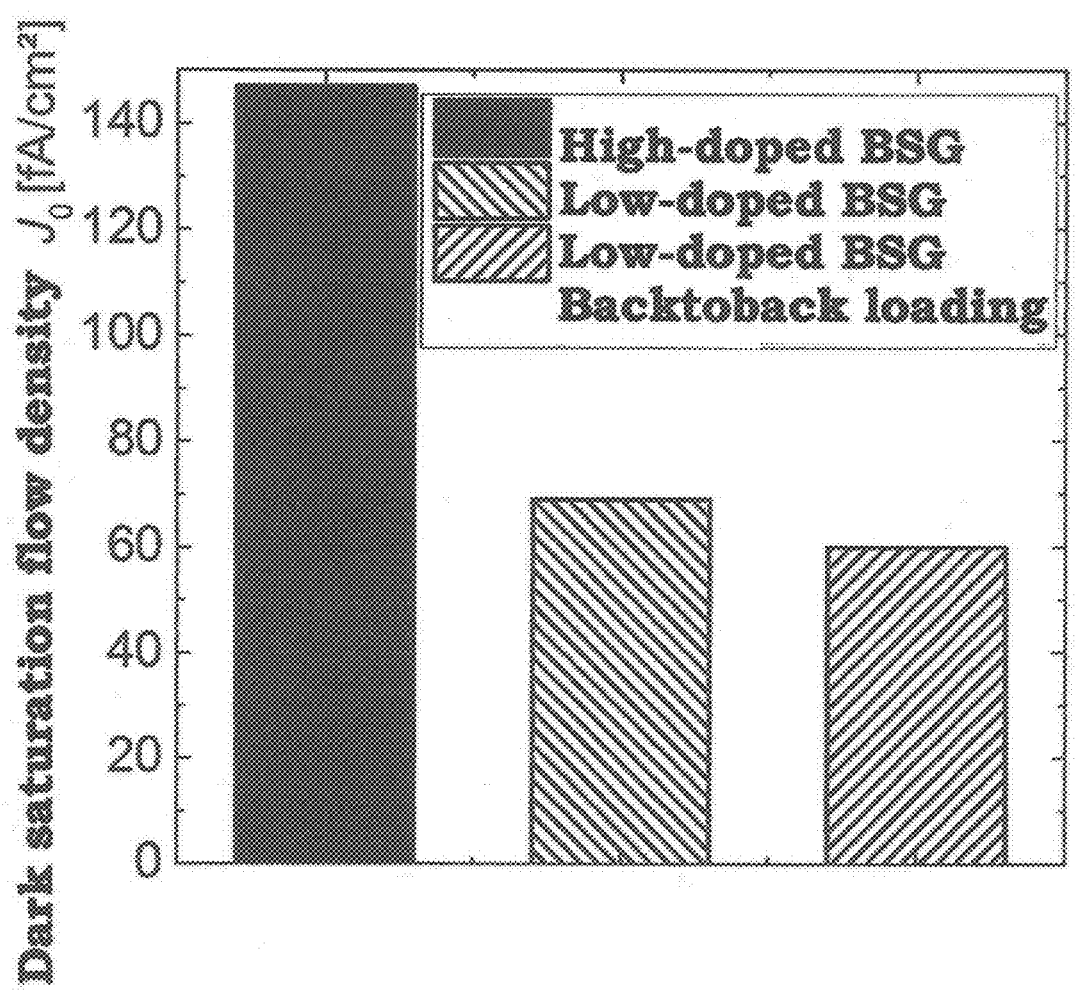
FIG. 2 depicts dark saturation flows of boron-doped regions for different dopant sources with single loading methods of the prior art (cross-hatched) and the "backtoback" loading method in accordance with an embodiment of the invention (solid black).

FIG. 2 shows dark saturation flows of boron-doped regions for different dopant sources with single loading and "backtoback" loading. It emerges clearly from this Figure that, by using the "backtoback" method, recombination is reduced and hence the operation of the solar cell is improved.

The invention claimed is:

1. A method for doping semiconductor substrates by a co-diffusion process, comprising
    a) coating a semiconductor substrate, at least on one side, with a layer comprising at least one first dopant, to obtain a coated semiconductor substrate having a coated layer, wherein the at least one first dopant is present in the coated layer and not within the semiconductor substrate,
    b) disposing respectively two of the coated semiconductor substrates from a), which still have the coated layers produced in a), in a process chamber such that two of their coated sides are in direct contact,
    c) introducing at least one second dopant, in the form of a gaseous dopant source, into the process chamber, and
    d) diffusing the first dopant and the second dopant into the semiconductor substrates at the same time, at least partially, wherein the first dopant diffuses into the semiconductor substrates from the coated layers provided in a).

2. The method according to claim 1, wherein, during step c), a particle concentration of the gaseous dopant source in an atmosphere within the process chamber is less than 0.5%.

3. The method according to claim 1, wherein, during step d), an atmosphere within the process chamber comprises oxygen at a concentration higher than 0.1% and lower than 5%.

4. The method according to claim 1, wherein, during step d), an oxygen content of a process atmosphere within the process chamber is increased such that the oxygen concentration at the beginning of step d) is lower than 5% and, at the end of step d), is higher than 10%.

5. The method according to claim 1, wherein, after step d), an oxygen content of a process atmosphere within the process chamber is increased during a cooling process, the oxygen concentration is higher than 10/%.

6. The method according to claim 1, wherein the concentration of the first dopant in the layer produced in step a) is less than 10%.

7. The method according to claim 1, wherein the introduction of the first and second dopant, in step d), is effected at temperatures of 800 to 1,000° C. and/or over a period of time of 1 to 120 min.

8. The method according to claim 1, wherein step c) is effected before and/or at the beginning of step d).

9. The method according to claim 1, wherein, during step c), a temperature within the process chamber is not higher than 850° C.

10. The method according to claim 1, wherein, from step c) to step d), a temperature within the process chamber is increased by 50 to 250° C.

11. The method according to claim 1, wherein, between step b) and se c), a temperature of several regions within the process chamber is adjusted such that the temperatures of these regions deviate from each other by less than 5° C. within the process chamber.

12. The method according to claim 11, wherein step c) is effected at the latest 60 seconds after concluding adjustment of a temperature in regions of the process chamber.

13. The method according to claim 1, wherein the first dopant is boron and the second dopant is phosphorus or the first dopant is phosphorus and the second dopant is boron.

14. The method according to claim 1, wherein:
    the second dopant is phosphorus and the gaseous dopant source is POCl$_3$ and/or PH$_3$, or
    the second dopant is boron and the gaseous dopant source is selected from the group consisting of BBr$_3$, BCl$_3$, B$_2$H$_6$ and mixtures thereof.

15. The method according to claim 1, wherein the gaseous dopant source in step c) is at a pressure less than 500 mbar.

16. The method according to claim 1, wherein the gaseous dopant source is POCl$_3$, which is introduced through a bubbler into the process chamber, and the carrier gas flow through the POCl$_3$ bubbler during step c) is less than 1.5 standard liters per minute.

17. The method according to claim 1, wherein the coating in step a) is effected by chemical vapour phase deposition at atmospheric pressure (APCVD), plasma-enhanced chemical vapour phase deposition (PECVD), inkjet printing, screen printing, or rotational coating.

18. The method according to claim 1, wherein the process chamber is a tube furnace or a continuous furnace.

19. The method according to claim 1, wherein, in step a), the semiconductor substrates are provided with the layer comprising the first dopant only on one side having an entire area, the coating on the one side being effected over the entire area.

20. The method according to claim 1,
    wherein the first dopant is boron and the second dopant is phosphorus or the first dopant is phosphorus and the second dopant is boron, and
    wherein, in step a), a front-side of each semiconductor substrate has an entire area and is provided, over the entire area, with the layer comprising the first dopant such that a first part of the first dopant is situated on the front-side of the semiconductor substrates, and a rear-side, situated opposite the front-side, of each semiconductor substrate is provided, only partially, with the layer comprising the first dopant such that a second part of the first dopant is situated on the rear-side of the semiconductor substrates, in step c) a main quantity of the second dopant is introduced into the process chamber and an additional quantity of the second dopant is introduced into the process chamber wherein the additional quantity of the second dopant is greater than the quantity of the first dopant situated on the rear-side of the semiconductor substrates to maintain electroneutrality.

21. A doped semiconductor substrate produced according to claim 20, wherein the semiconductor substrate has a lateral gradient in the dopant profile on the rear-side thereof, the proportion of first dopant, on the rear-side of the semiconductor substrate, decreasing from an edge of the semiconductor substrate towards the centre of the semiconductor substrate.

* * * * *